(12) United States Patent
Ingvarsson et al.

(10) Patent No.: US 7,192,491 B2
(45) Date of Patent: Mar. 20, 2007

(54) INCREASED DAMPING OF MAGNETIZATION IN MAGNETIC MATERIALS

(75) Inventors: Snorri T. Ingvarsson, White Plains, NY (US); Roger H. Koch, Amawalk, NY (US); Stuart S. Parkin, San Jose, CA (US); Gang Xiao, Barrington, RI (US)

(73) Assignee: International Business Machines Corporation, Armonk, NY (US)

( * ) Notice: Subject to any disclaimer, the term of this patent is extended or adjusted under 35 U.S.C. 154(b) by 716 days.

(21) Appl. No.: 10/195,178

(22) Filed: Jul. 15, 2002

(65) Prior Publication Data

US 2003/0029520 A1   Feb. 13, 2003

(51) Int. Cl.
*H01F 1/00* (2006.01)
*H01F 1/147* (2006.01)

(52) U.S. Cl. ............. 148/100; 148/306; 148/310; 148/311; 148/312; 148/313; 148/315

(58) Field of Classification Search ............ 148/100, 148/306, 310, 311, 312, 313, 315; 420/94, 420/96, 119, 122, 123, 127, 435, 441, 459, 420/580, 581, 590
See application file for complete search history.

(56) References Cited

U.S. PATENT DOCUMENTS

| | | | |
|---|---|---|---|
| 3,421,889 A | 1/1969 | Ostertag et al. | |
| 3,617,260 A * | 11/1971 | Detert | 420/435 |
| 3,755,796 A | 8/1973 | Griest, Jr. | |
| 3,973,920 A | 8/1976 | Tadokoro et al. | |
| 4,202,932 A | 5/1980 | Chen et al. | |
| 4,204,887 A * | 5/1980 | Masumoto et al. | 148/542 |
| 4,204,888 A * | 5/1980 | Masumoto et al. | 148/542 |
| 5,744,972 A | 4/1998 | Korenivski et al. | |
| 5,801,984 A * | 9/1998 | Parkin | 365/158 |
| 6,034,887 A | 3/2000 | Gupta et al. | |
| 6,153,020 A * | 11/2000 | Chen et al. | 148/120 |
| 6,254,695 B1 * | 7/2001 | Herzer et al. | 148/108 |
| 6,645,314 B1 * | 11/2003 | Herzer et al. | 148/108 |
| 2004/0069379 A1 * | 4/2004 | Herzer et al. | 148/304 |

OTHER PUBLICATIONS

M. Takahashi et al., "Saturation Magnetization and Uniaxial Magnetocrystalline Anisotropy for Co-based Binary and Co—Ge—Cr Ternary Alloys," American Institute of Physics, Allied Physics Letters, vol. 76, No. 23, pp. 3457-3459.

(Continued)

*Primary Examiner*—John P. Sheehan
(74) *Attorney, Agent, or Firm*—Ryan, Mason & Lewis, LLP; Stephen C. Kaufman, Esq.

(57) ABSTRACT

In order to dampen magnetization changes in magnetic devices, such as magnetic tunnel junctions (MTJ) used in high speed Magnetic Random Access Memory (MRAM), a transition metal selected from the 4*d* transition metals and 5*d* transition metals is alloyed into the magnetic layer to be dampened. In a preferred form, a magnetic permalloy layer is alloyed with osmium (Os) in an atomic concentration of between 4% and 15% of the alloy.

6 Claims, 3 Drawing Sheets

OTHER PUBLICATIONS

R.H. Koch et al., "Magnetization Reversal in Micron-Sized Magnetic Thin Films," The American Physical Society, Physical Review Letters, vol. 81, No. 20, pp. 4512-4514, Nov. 16, 1998.

T.J. Silva et al., "Inductive Measurement of Ultrafast Magnetization Dynamics in Thin-Film Permalloy," Journal of Applied Physics, vol. 85, No. 11, pp. 7849-7862, Jun. 1999.

F. Schreiber et al., "Gilbert Damping and g-Factor in $Fe_xCo_{1-x}$ Alloy Films," Solid State Communications, vol. 93, No. 12, pp. 965-968, 1995.

B. Heinrich et al., "Ferromagnetic-Resonance Study of Ultrathin bcc Fe(100) Films Grown Epitaxially on fcc Ag(100) Substrates," Physical Review Letters, vol. 59, No. 15, pp. 1756-1759, Oct. 12, 1987.

J.M. Rudd et al., "Anisotropic Ferromagnetic Resonance Linewidth in Nickel at Low Temperatures," Journal of Applied Physics, vol. 57(1), pp. 3693-3695, Apr. 15, 1985; and.

C.E. Patton et al., "Frequency Dependence of the Parallel and Perpendicular Ferromagnetic Resonance Linewidth in Permalloy Films, 2-36 GHz," Journal of Applied Physics, vol. 46, No. 11, pp. 5002-5003, Nov. 1975.

* cited by examiner

INCREASED DAMPING OF MAGNETIZATION IN MAGNETIC MATERIALS

CONTRACT INFORMATION

The invention was made at least in part with Government support under grant contract no. MDA972-99-C-0009 awarded by the Defense Advanced Research Projects Agency (DARPA) of the U.S. Department of Defense. The Government has certain rights in the invention.

PRIORITY INFORMATION

The instant application claims priority under 35 U.S.C. § 121 to U.S. Pat. No. 6,452,240, which is incorporated herein by reference.

BACKGROUND OF THE INVENTION

The present invention relates generally to damping of magnetization changes in magnetic materials. The invention is of particular advantage in any high speed magnetic devices wherein the function of such devices requires changing the magnetization direction of a magnetic layer or other magnetic region of the device.

It has been shown that thin magnetic films of the magnetic transition metal alloys are severely underdamped. For example *Silva et. al. J. Appl. Phys. Vol* 85 *no.* 11 *p.* 7849 (1999) describe magnetization oscillations in thin Permalloy ($Ni_{81}Fe_{19}$) films after magnetic switching. *Myrtle et. al. J. Appl. Phys. Vol.* 57, *no.* 1 *p.* 3693 (1985), *Heinrich et. al. Phys. Rev. Lett. Vol.* 59 *no.* 15 *p.* 1756 (1987) and *Schreiber et. al. Sol. St. Comm. Vol.* 93 *no* 12 *p* 965 (1995) describe measurement results of damping in Ni, Fe, and Co, all with very small magnetic damping parameters. Alloys of these materials also have damping parameters in the same order of magnitude as their constituents, *Patton et. al. J. Appl. Phys. Vol.* 46 *no.* 11 *p.* 5002 (1975) and *Schreiber et. al. Sol. St. Comm. Vol.* 93 *no* 12 *p* 965 (1995).

Any high speed magnetic devices, including spin valves and MTJ's (magnetic tunnel junctions), that require a fast change in magnetization direction, i.e. switching of magnetization between equilibrium positions, as part of their function will potentially suffer from magnetic oscillations. These magnetic oscillations can in some cases be large enough that the final equilibrium state becomes unpredictable, i.e. the device can relax to the wrong equilibrium state. This obviously causes severe control problems.

It is desireable to adjust the magnetization damping in magnetic devices to reduce magnetic oscillations after switching and to open an opportunity to engineer devices to optimise their time response.

SUMMARY OF THE INVENTION

The present invention broadly provides a method for increasing damping of a magnetic material within a magnetic device, the magnetic material comprising an alloy. The method includes the step of adding to the alloy at least one transition metal selected from the group consisting of 4*d* transition metals and 5*d* transition metals in an atomic concentration of about 4% to about 15% of the alloy, wherein the alloy comprises at least one of Ni—Fe, Co—Fe, and Ni—Co.

According to a preferred embodiment of the invention, the magnetic device is operable as a spin valve and comprises at least two magnetic layers and a nonmagnetic layer therebetween, wherein the two magnetic layers have at least two stable magnetization relationships, and wherein at least one of said at least two magnetic layers comprises the aforesaid alloy.

According to a second preferred embodiment of the invention, the magnetic device is operable as a magnetic tunnel junction and comprises at least two magnetic layers and an insulating barrier layer therebetween, wherein the two magnetic layers have at least two stable magnetization relationships, and wherein at least one of said at least two magnetic layers comprises the aforesaid alloy.

DETAILED DESCRIPTION

Figure 1:
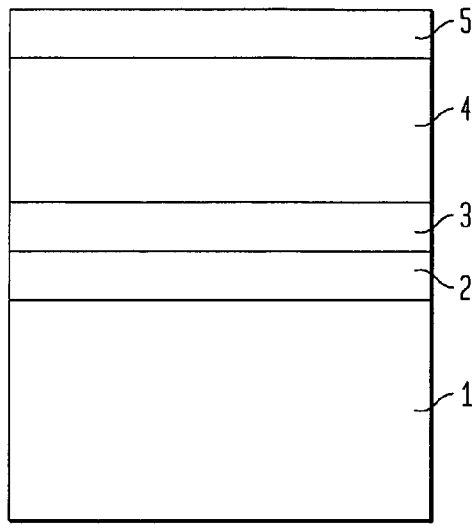
FIG. 1 is a schematic cross-sectional view of a test structure of a magnetic device that includes a magnetic material.

One way of testing the invention is to make a magnetic test structure suitable for ferromagnetic resonance measurements (FMR), e.g. a thin circular disk. FIG. 1 is a sketch of the cross sectional view of one of our simple test structures. These test structures were made on commercially available oxidised silicon substrates, 1 and 2. On top of these were deposited, by dc-magnetron sputtering in a high vacuum chamber, 40 Angstrom thick layer 3 of Tantalum (Ta), 500 Angstrom thick layer 4 of magnetic alloys, and 40 Angstrom thick layer 5 of Ta (for protection against oxidation of the magnetic alloys). The magnetic layer can, for example, be any of the transition metal magnetic elements, Iron (Fe), Nickel (Ni), Cobalt (Co) or any alloy thereof, or it could be one of the so-called Heusler alloys. In accordance with the present invention, these magnetic layers are alloyed with an element of the 4*d* or 5*d* transition metals.

One embodiment is with $Ni_{80}Fe_{20}$, Permalloy, as the magnetic host, which is alloyed with, for example, Osmium (Os), with a 6% atomic concentration of Os. The alloy was sputtered from a commercially available alloyed sputter target of the same concentration. In order to best measure the damping properties of the test structure it should be patterned into a circular disk, for example by using a shadow mask during deposition or by photolithography on a sheet film. For our experiment it is preferred that the dot size is smaller than 2 mm in diameter, in the case of Permalloy. This is governed by the experimental apparatus and the frequency at which the uniform mode of magnetic precession in the magnetic material is resonant. The higher the resonance frequency, the smaller size sample can be tolerated if the ac-magnetic field is to remain uniform across the sample. The experimental method used to measure the complex magnetic response of our samples is based on U.S.

Pat. No. 5,744,972, which describes how to measure such response using only a network analyzer or computer controlled impedance analyzer and a single current loop. The sample is placed in a Copper (Cu) current loop that is connected by a coaxial cable to a HP8720 network analyzer. The analyzer is previously calibrated with the appropriate calibration connectors. It was found that the best results are obtained when the current loop itself is used as a short calibration, but with an external field applied in order to saturate the magnetic material in the direction parallel to the direction of the alternating magnetic field generated by the network analyzer. By changing the applied magnetic field the analyzer then yields the complex impedance associated with the state of the magnetic material determined by the external magnetic field. This impedance, Z, is connected with the susceptibility of the magnetic material, $\chi$ according to equation (3) in U.S. Pat. No. 5,744,972, $$Z = j\omega \frac{V}{w^2} k_H \Psi \mu_0 \chi, \qquad (1)$$

where $\omega/2\pi$ is frequency, V is the sample volume, w is the width of the current loop and $\mu_0$ is the permeability of free space. Two factors, $k_H$ and $\Psi$ take into account geometrical effects on the generation of magnetic field within the loop and on the pickup of magnetic flux through the loop from the precessing magnetic moment of the sample.

We choose to express the damping in terms of the Gilbert damping parameter, $\alpha$, that enters the Gilbert form of the Landau-Lifshitz equation of motion for magnetization, $$\frac{dM}{dt} = -\gamma M \times H - \frac{a}{M} M \times \frac{dM}{dt}, \qquad (2)$$

where $\gamma$ is the gyromagnetic ratio, M is magnetization, H is effective magnetic field and t is time. A linearization of (2) gives the following form for the susceptibility when the dc applied field is perpendicular to the direction of the ac field generated by the current loop, $$\chi = \frac{\gamma^2 M \left(H + \left(4\pi + \frac{H_k}{M}\right)M\right) + i\frac{\omega}{\gamma}a}{\omega_{r,a=0}^2 - \omega^2(1+a^2) + i\omega a\gamma\left(2H + \left(4\pi + \frac{2H_k}{M}\right)M\right)}, \qquad (3)$$

where $H_k$ is an in-plane uniaxial anisotropy field, and surface effects are neglected. Exchange effects and rf-skin depth effects are negligible at the relatively low, $\leq 3$ GHz, frequency at which Permalloy films resonate and the geometric dimensions of our test structure. The undamped resonance frequency is defined as, $$\omega_{r,a=0}^2 = \gamma^2 \left(H + \left(4\pi + \frac{H_k}{M}\right)M\right)(H+H_k). \qquad (4)$$

DC-values for the saturation magnetization can be obtained with any suitable DC-magnetometry technique, such as vibrating sample magnetometry (VSM), alternating gradient magnetometry (AGM) or SQUID-magnetometry. The saturation magnetization is assumed the same at GHz frequencies. The anisotropy field can also be determined by the above mentioned techniques, however, it is known that at high frequency results for anisotropy can differ substantially from the dc-results. Hence it is better to obtain the anisotropy field from the angular dependence of the resonance frequency. With these parameters determined it is easy to fit (3) to experimental results for the susceptibility to determine the damping parameter, $\alpha$.

Figure 2A:
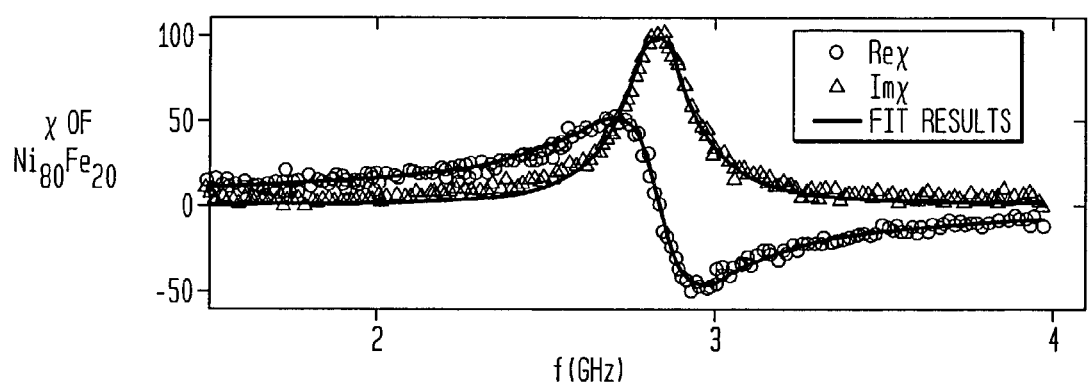
FIG. 2*a* is a plot of magnetic susceptibility versus frequency of applied magnetic field for a permalloy sample prepared according to the prior art.
Figure 2B:
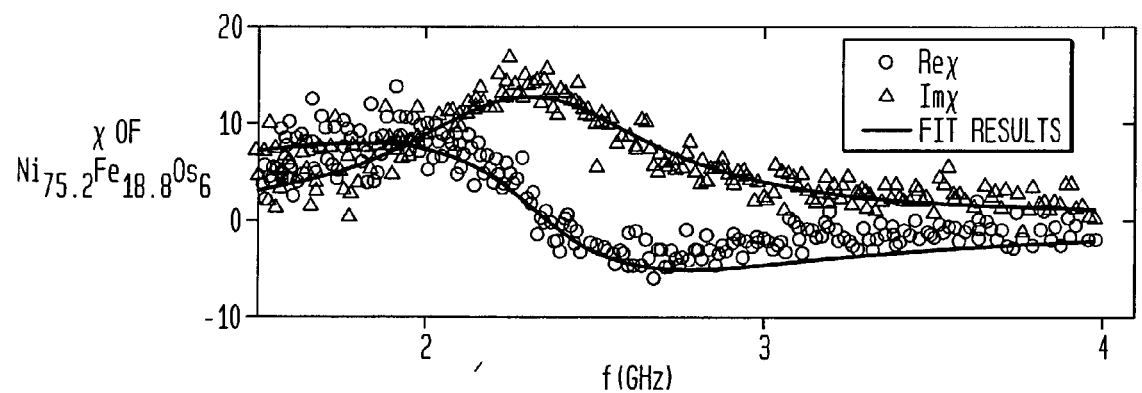
FIG. 2*b* is a plot of magnetic susceptibility versus frequency of applied magnetic field for a permalloy sample prepared according to the present invention.

Results of such fits are shown in FIG. 2a) and 2b). The experimentally determined susceptibility of a Permalloy film is shown in FIG. 2a), which should be compared to the result in FIG. 2b) which are from an alloy of Permalloy and Osmium in 6% atomic concentration (in accordance with the present invention). Circles and triangles represent the real and imaginary part of the susceptibility, respectively, and the solid lines are numerical fits according to (3). This experimental procedure, with the test structure chosen, reveals the intrinsic magnetic damping properties of the bulk film, i.e. surface effects are negligible. The damping is sometimes quoted as linewidth, i.e. the width of the resonance peak at half the maximum height of the peak ("full width at half maximum (FWHM)"). The linewidth in FIG. 2b), which results when Permalloy contains 6% atomic concentration of Osmium, is clearly much greater than in FIG. 2a), which depicts results for pure Permalloy. The linewidth is directly related to the damping parameter $\alpha$. The greater linewidth in FIG. 2b) is reflected as a larger damping parameter.

Figure 3:
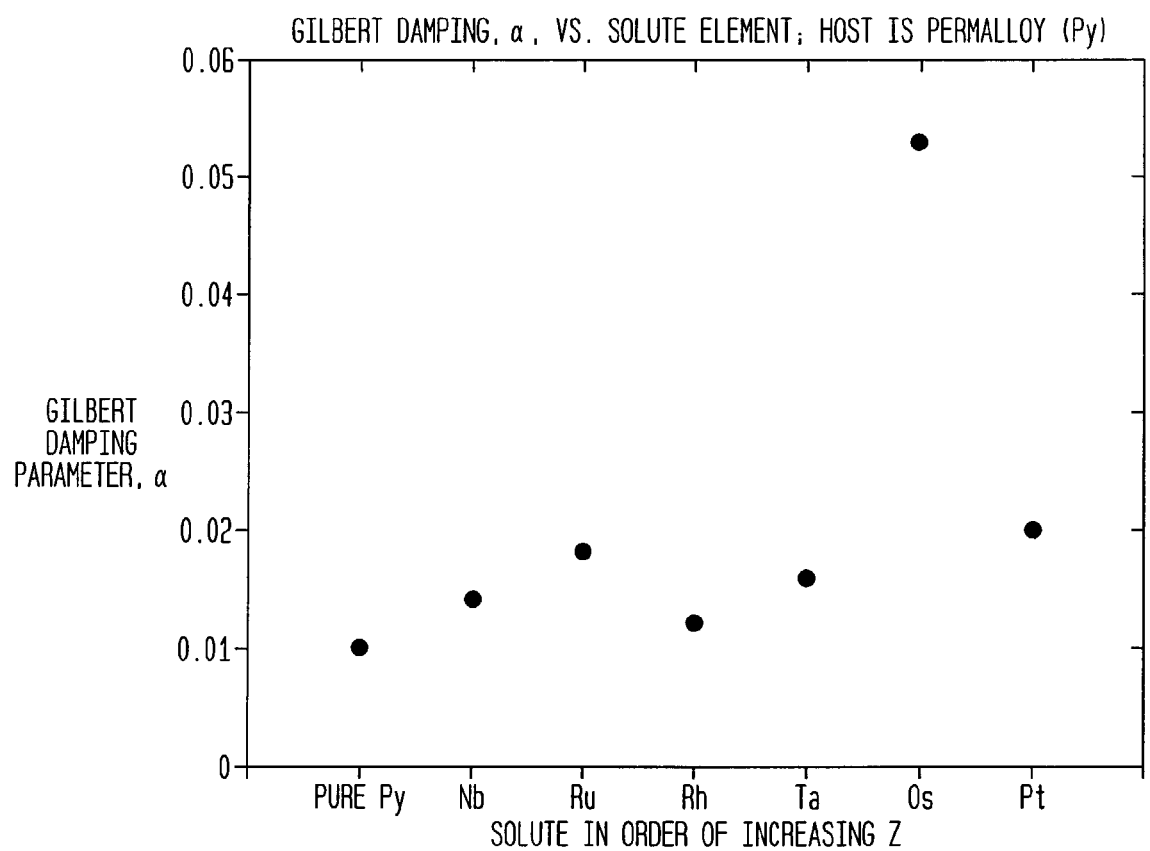
FIG. 3 is a plot of Gilbert damping parameter α for a number of solutes in a permalloy host sample.

A graphic summary of results on various different alloys of 4d and 5d transition metal elements alloyed with Permalloy is shown in FIG. 3. There the Gilbert damping parameter is plotted against solute element in terms of increasing atomic number, Z. A tabular form of these results is shown in Table 1. Note that both Rhodium (Rh) and Platinum (Pt) have atomic concentrations differing from 6% in FIG. 3, 5% Rh and 10% Pt respectively.

TABLE 1

| Solute | α | Conc. (at. %) | $H_k$ (Oe) | $H_c$ (Oe) |
|---|---|---|---|---|
| none | 0.007 |  | 796 | 5.07 | 1.03 |
| Pt | 0.020 | 10 | 649 | 2.97 | 4.00 |
| Ta | 0.016 | 6 | 417 | 2.72 | 0.79 |
| Os | 0.053 | 6 | 462 | 4.59 | 1.99 |
| Nb | 0.014 | 6 | 492 | 2.97 | 1.56 |
| Rh | 0.012 | 5 | 670 | 3.90 | 1.59 |
| Ru | 0.018 | 6 | 498 | 2.69 | 0.92 |

Figure 4:
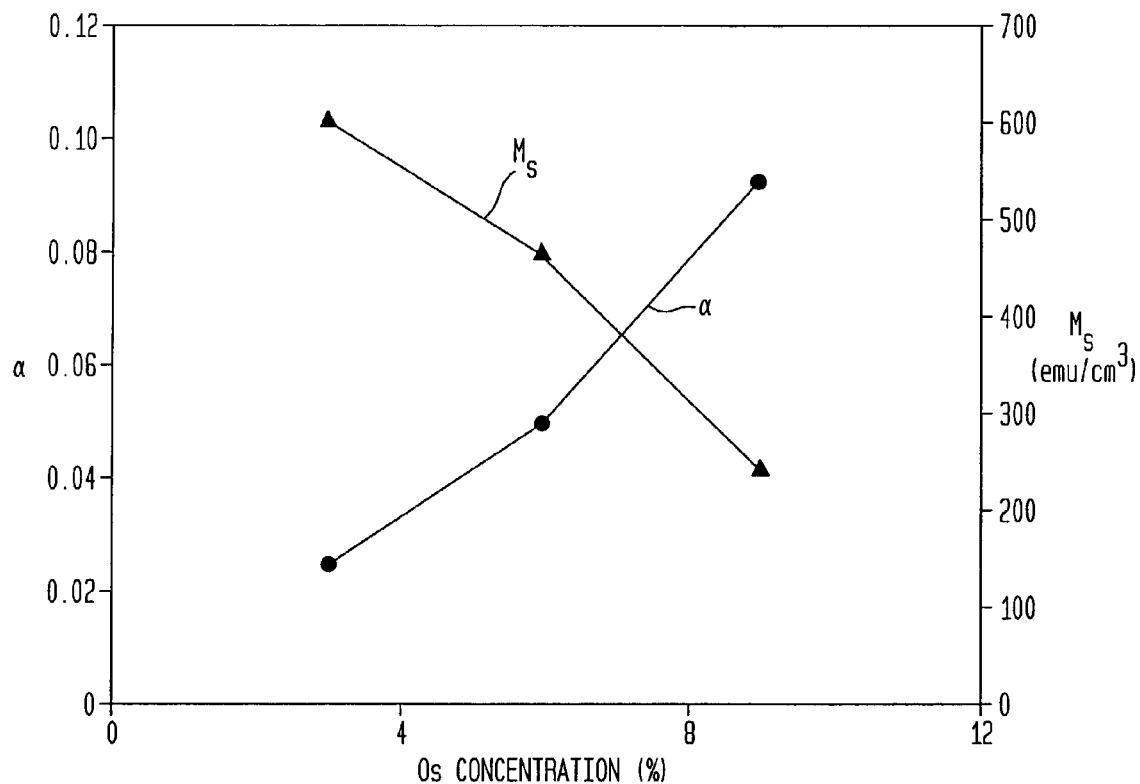
FIG. 4 shows the plots of Gilbert damping parameter α and saturation magnetization $M_s$ versus Osmium concentration.

Osmium in 6% atomic concentration results in damping more than 7-fold the value for pure Permalloy. The dependence of the Gilbert damping parameter and the saturation magnetization on Osmium concentration in Permalloy is shown in FIG. 4. Gilbert damping (circles) increases with Osmium concentration, whereas saturation magnetization (triangles) decreases.

Figure 5:
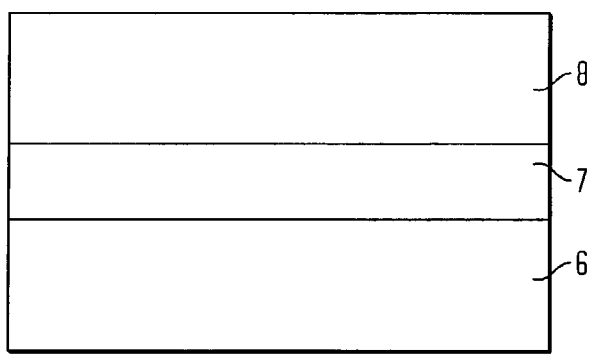
FIG. 5 is a schematic cross-sectional view of a magnetic tunnel junction (MTJ) device.

A specific example of application of the invention in a magnetic device is in a spin valve or a magnetic tunnel junction, as are used in MRAM (magnetic random access memory). A magnetic tunnel junction is shown in FIG. 5 where 6 and 8 are magnetic layers, separated by an insulating, nonmagnetic tunnel barrier 7, for example, oxidised aluminum (Al). The resistance of such a device, as measured between the magnetic layers, is strongly dependent on the relative magnetization orientation of the magnetic layers. Typically, one of the magnetic layers is held fixed, while the other is "switched" by reversing its magnetic direction (rotation of 180 degrees). If either one or both of the magnetic layers (most importantly, the layer being switched, often referred to as a "free layer"), 6 and 8, are alloys as described above, the magnetic oscillations associated with the switching of the device can be damped, resulting in a shorter recovery time and much better control over the final state after switching.

While the present invention has been described with reference to preferred embodiments thereof, numerous obvious changes and variations may readily be made by persons skilled in the field of magnetic devices. Accordingly, the invention should be understood to include all such variations to the full extent embraced by the claims.

What is claimed is:

1. A method for increasing damping of a magnetic material within a magnetic device, said magnetic material comprising an alloy, said method comprising adding to said alloy at least one transition metal selected from the group consisting of 4*d* transition metals and 5*d* transition metals in an atomic concentration of about 4% to about 15% of said alloy, wherein said alloy comprises at least one of Ni—Fe, Co—Fe, and Ni—Co.

2. The method of claim 1 further comprising the step of measuring said damping as a function of a Gilbert damping parameter of said magnetic material.

3. The method of claim 1 wherein said transition metal is selected from the group consisting of osmium, niobium, ruthenium, rhodium, tantalum, platinum, iridium, palladium, rhenium, molybdenum, and tungsten.

4. A method for forming a magnetic device, said magnetic device having a magnetic material comprising an alloy, the method comprising the step of adding to said alloy at least one transition metal selected from the group consisting of 4*d* transition metals and 5*d* transition metals in an atomic concentration of about 4% to about 15% of said alloy, wherein said alloy comprises at least one of Ni—Fe, Co—Fe, and Ni—Co and wherein the adding step increases damping of said magnetic material.

5. The method of claim 4 wherein said magnetic device comprises a magnetic tunnel junction.

6. The method of claim 4 wherein said magnetic device comprises a spin valve.

* * * * *